United States Patent
Eichfeld et al.

(10) Patent No.: US 6,531,886 B1
(45) Date of Patent: Mar. 11, 2003

(54) DEVICE FOR REDUCING THE ELECTROMAGNETIC EMISSION IN INTEGRATED CIRCUITS WITH DRIVER STAGES

(75) Inventors: Herbert Eichfeld, München (DE); Dirk Römer, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/857,511

(22) PCT Filed: Dec. 1, 1999

(86) PCT No.: PCT/DE99/03821

§ 371 (c)(1),
(2), (4) Date: Aug. 10, 2001

(87) PCT Pub. No.: WO00/33463

PCT Pub. Date: Jun. 8, 2000

(30) Foreign Application Priority Data

Dec. 1, 1998 (DE) .......................................... 198 55 445

(51) Int. Cl.[7] .............................................. H03K 17/16
(52) U.S. Cl. ............................................ 326/21; 326/33

(58) Field of Search ................................ 326/21, 26–27, 326/31, 33–34

(56) References Cited

U.S. PATENT DOCUMENTS 4,783,603 A * 11/1988 Goforth et al. ............... 326/71
5,654,929 A * 8/1997 Mote, Jr. ..................... 365/222
6,140,865 A * 10/2000 Kawamura .................. 327/551

FOREIGN PATENT DOCUMENTS

DE    197 00 988 A1    7/1997
JP    01 098 317    4/1989

* cited by examiner

Primary Examiner—Michael Tokar
Assistant Examiner—James H Cho
(74) Attorney, Agent, or Firm—Laurence A. Greenberg; Werner H. Stemer; Gregory L. Mayback

(57) ABSTRACT

A device for reducing the electromagnetic emission in integrated circuits having driver stages reduces the electromagnetic emission of an integrated circuit without requiring an increase in the blocking capacitance in the process. This is achieved by combining driver stages which do not switch simultaneously to form driver groups, and special wiring of a plurality of blocking capacitors.

10 Claims, 2 Drawing Sheets

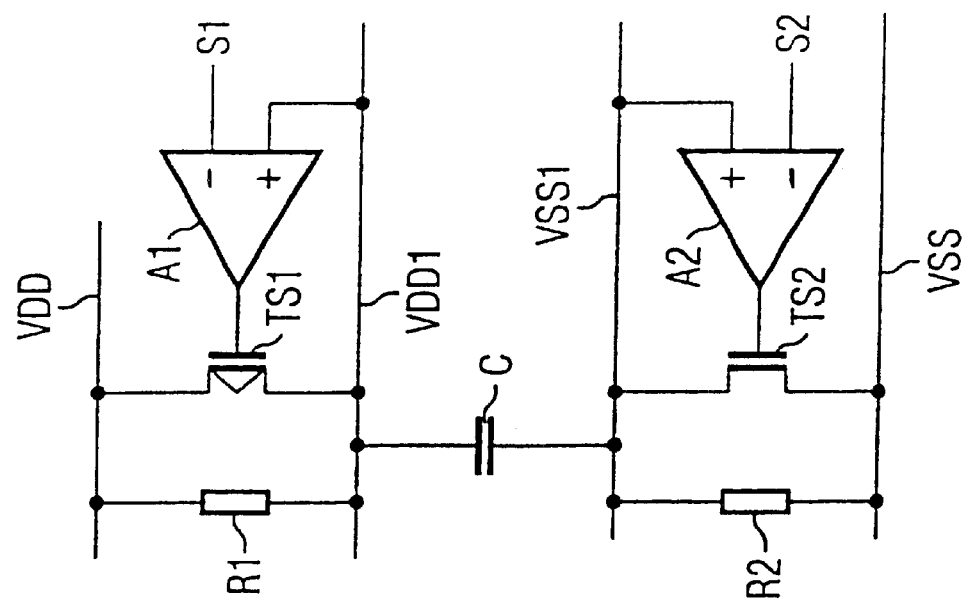
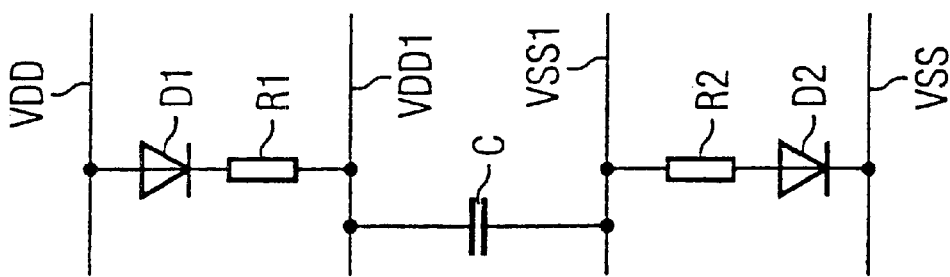
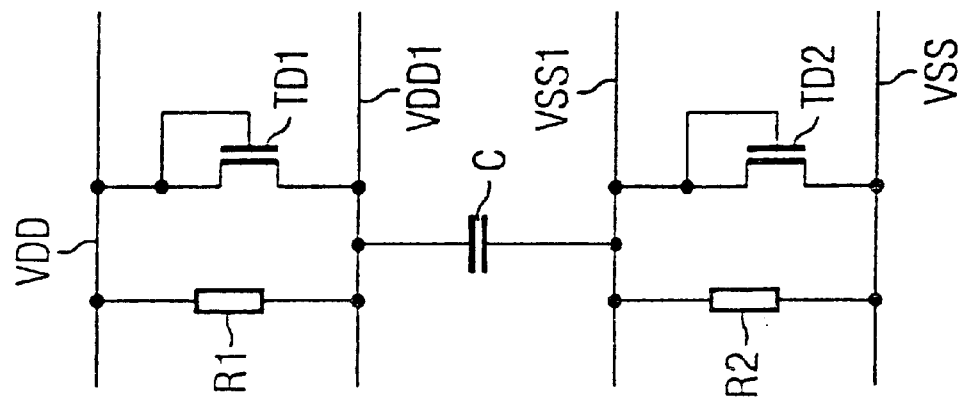

DEVICE FOR REDUCING THE ELECTROMAGNETIC EMISSION IN INTEGRATED CIRCUITS WITH DRIVER STAGES

BACKGROUND OF THE INVENTION

1. Field of the Invention

The invention relates to an integrated circuit having a plurality of driver stages, in which blocking capacitors suppress electromagnetic emission (EME) as a result of switching operations of the drivers onto the supply voltage lines.

2. Description of the Related Art

In order to reduce the electromagnetic emission of integrated circuits, large on-chip capacitances of the order of magnitude of, for example, 1 to 10 nF are integrated. These blocking capacitances serve for smoothing the supply voltages or as an energy reserve, in particular for strong drivers. Their effect is all the better, the larger the capacitances or the lower the impedance with which they are connected. Therefore, as far as possible every free chip area of a semiconductor component is utilized for forming these blocking capacitances. Enlarging these blocking capacitors by means of a larger chip area or, alternatively, by means of thinner or special dielectrics means increased costs. Added to this is the fact that ever more compact layouts are being produced by ever better design tools, which means fewer and fewer free areas for such blocking capacitances.

SUMMARY OF THE INVENTION

The invention is based on the object, then, of specifying a device for reducing the electromagnetic emission in integrated circuits having a plurality of driver stages, in which the electromagnetic emission is reduced as far as possible without increasing the capacitance of the blocking capacitors.

This object is achieved according to the invention by means of the features of patent claim 1. The rest of the claims relate to advantageous refinements of the invention.

BRIEF DESCRIPTION OF THE DRAWING

FIGS. 3 to 5 show three different variants of the blocking capacitor unit of FIG. 2.

DESCRIPTION OF THE PREFERRED EMBODIMENTS

The invention is essentially based on the fact that, as a rule, not all of the strong drivers of a module switch simultaneously. Drivers having different switching instants in the processing cycle of a module are combined to form a driver group and are jointly supplied by a blocking capacitance which can just deliver the largest charge requirement of this driver group. Furthermore, rare peak load situations are compensated by voltage control or voltage regulation of the local supply voltages and the blocking capacitance can be designed to be lower on account of this.

Figure 1:
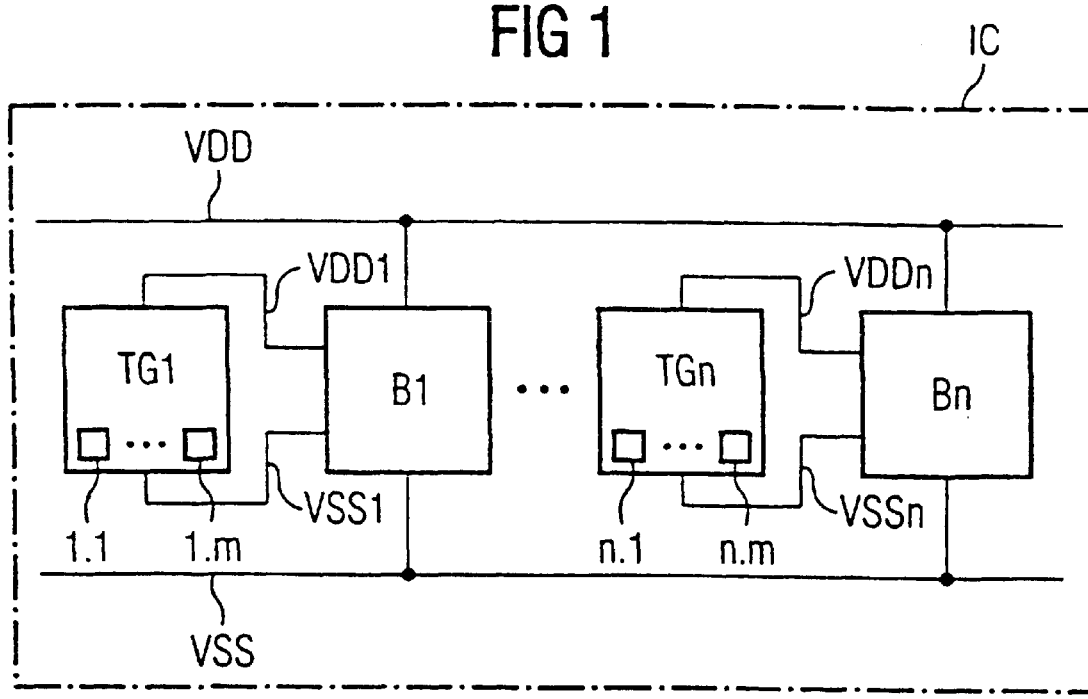
FIG. 1 shows a block diagram with a plurality of driver groups and blocking capacitor units.

FIG. 1 illustrates an integrated circuit IC having global supply voltage lines VDD and VSS. The integrated circuit IC can also have more than two global supply voltage lines. Via respective blocking units B1 . . . Bn, which are jointly supplied via the global supply voltage lines, respective driver groups TG1 and TGn are supplied via respective local supply voltage lines VDD1 and VSS1 . . . VDDn and VSSn. The driver group TG1 illustrated by way of example in this case contains drivers 1.1 . . . 1.m and a driver group TGn illustrated by way of example contains drivers n.1 . . . n.m, in each driver group at least all the drivers with a large current requirement switching at different times.

Figure 2:
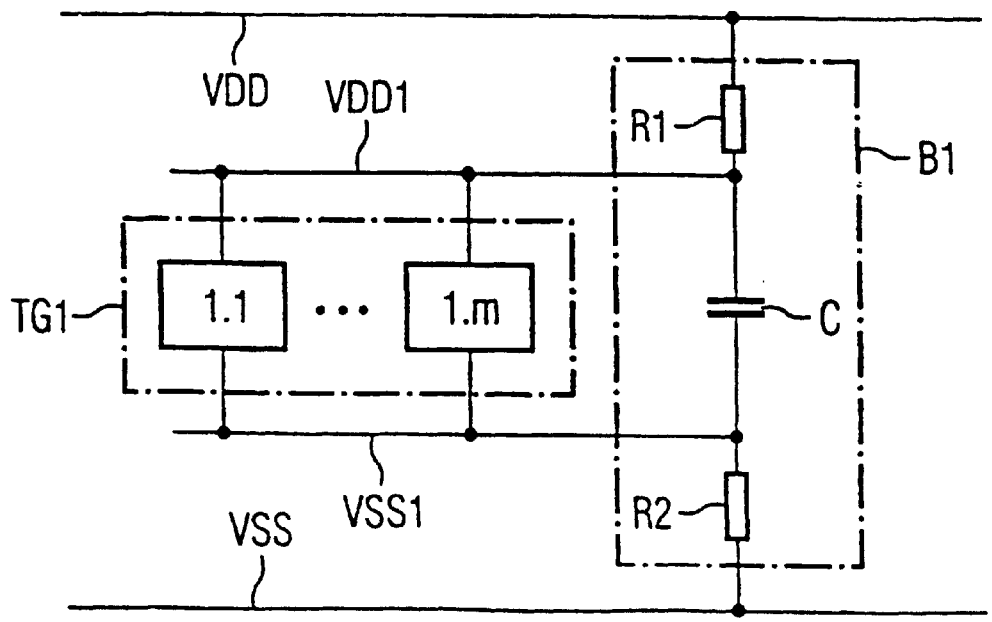
FIG. 2 shows a more detailed block diagram with an individual driver group and an individual blocking capacitor unit.

A driver group TG1 and a blocking unit B1 are illustrated in more detail in FIG. 2. All the drivers 1.1 . . . 1.m of the driver group TG1 are connected to a first terminal of a blocking capacitor C via a local supply voltage line VDD1 and to a second terminal of the blocking capacitor C via the local supply voltage line VSS1. In addition to the blocking capacitor, the blocking unit B1 also has a resistor R1 and a resistor R2, the resistor R1 connecting the first terminal of the blocking capacitor C to the global supply voltage VDD and the resistor R2 connecting the second terminal of the blocking capacitor C to the global supply voltage line VSS. In this case, the resistors R1 and R2 are generally of the same size. The dimensioning of the resistors and of the capacitor depend on the permissible supply voltage fluctuation on the local supply lines VDD1 and VSS1. This RC arrangement keeps away radiofrequency interference from the global supply. This is more successful, the larger the dimensioning of the resistors R1 and R2.

FIGS. 3, 4 and 5 illustrate advantageous developments of the blocking unit B1 which, by virtue of additional voltage control or regulation, allow the capacitance of the blocking capacitor C to be reduced.

In FIG. 3, a MOS transistor TD1 and TD2 connected as diode is in each case connected in parallel with the resistor R1 and/or with the resistor R2. The MOS transistors connected as diode may individually or both also be designed as customary pn diodes. Furthermore, a series circuit formed by corresponding pn diodes or MOS diodes is also possible, the internal voltage reduction for $R1=R2\rightarrow\infty$ being equal to $2*n*V_T$, when n is the number of series-connected diodes and $V_T$ is the threshold voltage of the individual diode.

Furthermore, FIG. 4 illustrates a further embodiment of the blocking unit B1, in which, instead of the resistor R1, there is a series circuit formed by the resistor R1 and a diode D1 and/or, instead of the resistor R2, there is a series circuit formed by the resistor R2 and a further diode D2. In the case of the series circuit illustrated in FIG. 4, too, not only the pn diodes but also MOS diodes can be used, in which case, too, a plurality may be connected in series. As a result of an exponential diode characteristic, it is possible to rapidly compensate for voltage dips on the local supply voltage line VDD1 as a result of a strong current via the diode D1 and the resistor R1 prevents an excessive current rise, which would mean correspondingly strong electromagnetic emission.

In FIG. 5, in a final exemplary embodiment, an actuating transistor TS1 is connected in parallel with the resistor R1 and is driven via a regulating amplifier, in the regulating amplifier A1 the voltage on the local supply voltage line VDD1 being compared with a desired value S1. The same applies correspondingly to the resistor R2, with which a further actuating transistor TS2 is connected in parallel which, for its part, is driven by a further regulating amplifier A2. In this case, the regulating amplifier A2 compares the voltage on the local supply line VSS1 with a further desired value S2. However, it is also possible for an actuating transistor to be connected in parallel with only one of the two resistors R1 and R2. The more complex regulation affords the advantage that the desired value of the voltage dip on the local network is adjustable. In this case, the actuating transistor TS is a p-channel transistor and the actuating transistor TS2 is an n-channel transistor. If the local supply voltage on the supply voltage line VDD1 falls below the desired value S1, then the amplifier A1 turns the actuating transistor TS1 on and, in addition to a current through the resistor R1, a current flows through the transistor TS1. The same applies correspondingly to the resistor R2 and the transistor TS2.

What is claimed is:

1. A device for reducing electromagnetic emission in an integrated circuit being supplied by a first and second global supply line, comprising:

a plurality of driver stages combined to form driver groups, said driver stages of a given driver group all switching at different instants;

respective first and second local supply lines for each driver group;

a respective blocking unit for each driver group connected to said respective driver group by said respective first and second local supply lines, each blocking unit containing a blocking capacitor and connected to the first and second global supply line, said blocking capacitor being dimensioned depending on a permissible supply voltage fluctuation on said first and second local supply lines and depending on a largest charge requirement of a respective driver group.

2. The device according to claim 1, wherein:

said first and said second local supply lines are connected via said blocking capacitor;

a first resistor connects said respective first local supply line to the first global supply line; and a second resistor connects said respective second local supply line to the second global supply line.

3. The device according to claim 2, including a diode being connected in parallel with at least one of said first and said second resistors, said diode being selected from the group consisting of a pn diode and a MOS transistor connected as a diode.

4. The device according to claim 2, including a series circuit of diodes being connected in parallel with at least one of said first and said second resistors, said diodes being selected from the group consisting of a pn diode and a MOS transistor connected as a diode.

5. The device according to claim 2, including a diode being connected in series to said first resistor, said diode and said first resistor interconnecting said first local supply line and the first global supply line;

said diode being selected from the group consisting of a pn diode and a MOS transistor connected as a diode.

6. The device according to claim 2, including a series circuit of diodes being connected in series to said first resistor, said series circuit of diodes and said first resistor interconnecting said first local supply line and the first global supply line;

said diodes being selected from the group consisting of pn diodes and MOS transistors connected as diodes.

7. The device according to claim 2, including;

a first diode being connected in series to said first resistor, said first diode and said first resistor interconnecting said first local supply line and the first global supply line; and a second diode being connected in series to said second resistor, said second diode and said second resistor interconnecting said second local supply line and the second global supply line;

said diodes being selected from the group consisting of pn diodes and MOS transistors connected as diodes.

8. The device according to claim 2, including:

a first series circuit of diodes being connected in series to said first resistor, said first series circuit of diodes and said first resistor interconnecting said first local supply line and the first global supply line; and a second series circuit of diodes being connected in series to said second resistor, said second series circuit of diodes and said second resistor interconnecting said second local supply line and the second global supply line;

said diodes being selected from the group consisting of pn diodes and MOS transistors connected as a diode.

9. The device according to claim 2, including:

an actuating transistor being connected in parallel with at least one of said first and second resistors; and a regulating amplifier driving said transistor and turning said transistor on when the voltage of the respective local supply line is less than a desired value.

10. The device according to claim 1, wherein the respective blocking capacitor includes a plurality of capacitors connected in parallel and distributed over free areas of the integrated circuit.

* * * * *